United States Patent [19]

Tanaka et al.

[11] Patent Number: 5,216,280
[45] Date of Patent: Jun. 1, 1993

[54] SEMICONDUCTOR INTEGRATED CIRCUIT DEVICE HAVING PADS AT PERIPHERY OF SEMICONDUCTOR CHIP

[75] Inventors: Yasunori Tanaka; Kyohsuke Ogawa, both of Yokohama, Japan

[73] Assignee: Kabushiki Kaisha Toshiba, Kawasaki, Japan

[21] Appl. No.: 826,632

[22] Filed: Jan. 23, 1992

Related U.S. Application Data

[63] Continuation of Ser. No. 619,995, Nov. 30, 1990, abandoned.

[30] Foreign Application Priority Data

Dec. 2, 1989 [JP] Japan .................................. 1-312276

[51] Int. Cl.⁵ ............................................. H01L 23/48
[52] U.S. Cl. ..................................... 257/734; 257/508; 257/503; 257/700; 257/691
[58] Field of Search .................... 357/45, 68, 71; 257/734, 508, 503, 700, 691, 734

[56] References Cited

U.S. PATENT DOCUMENTS

| 4,631,569 | 12/1986 | Calhoun | 357/45 |
|---|---|---|---|
| 4,646,126 | 2/1987 | Iizuka | 357/68 |
| 4,688,070 | 8/1987 | Shiotari et al. | 357/68 |
| 4,734,754 | 3/1988 | Nikawa | 357/68 |
| 4,746,965 | 5/1988 | Nishi | 357/68 |
| 4,841,354 | 6/1989 | Inabe | 357/68 |
| 4,881,029 | 11/1989 | Kawamura | 357/68 |
| 4,905,068 | 2/1990 | Satoh et al. | 357/68 |
| 4,916,521 | 4/1990 | Yoshikawa et al. | 357/68 |
| 5,016,087 | 5/1991 | Haug et al. | 357/75 |
| 5,148,263 | 9/1992 | Hamai | 357/71 |

FOREIGN PATENT DOCUMENTS

| 2508255 | 12/1982 | France . | |
| 57-45940 | 3/1982 | Japan . | |
| 59-92258 | 6/1983 | Japan . | |
| 60-70742 | 4/1985 | Japan . | |
| 60-79744 | 5/1985 | Japan . | |
| 60-182756 | 9/1985 | Japan . | |
| 61-5545 | 1/1986 | Japan | 357/68 |
| 61-97852 | 5/1986 | Japan . | |

OTHER PUBLICATIONS

Kenyon et al., "Two-level wiring system", IBM TDB, vol. 19, No. 5, Oct. 1976, pp. 1628-1629.

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

For increasing the number of pads to be connected to external terminals such as leads of a lead frame without increasing an area of a semiconductor IC chip, pads are disposed at a periphery of the chip in such a manner that they are arranged in at least first and second rows, to which at least first and second groups of interconnection layers insulated through an interval insulator are electrically connected, respectively.

10 Claims, 8 Drawing Sheets

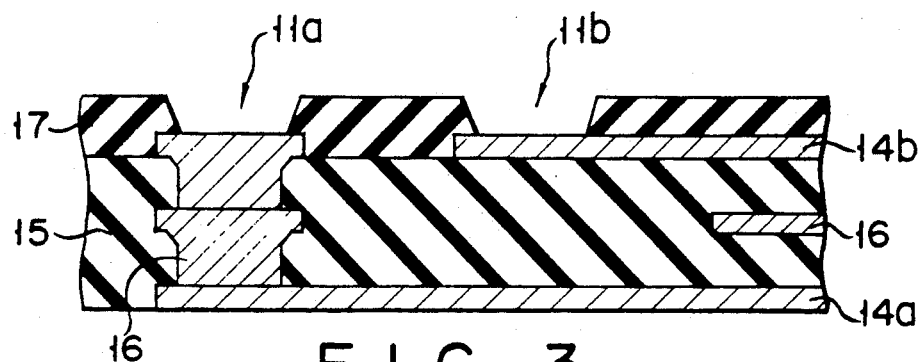
F I G. 3
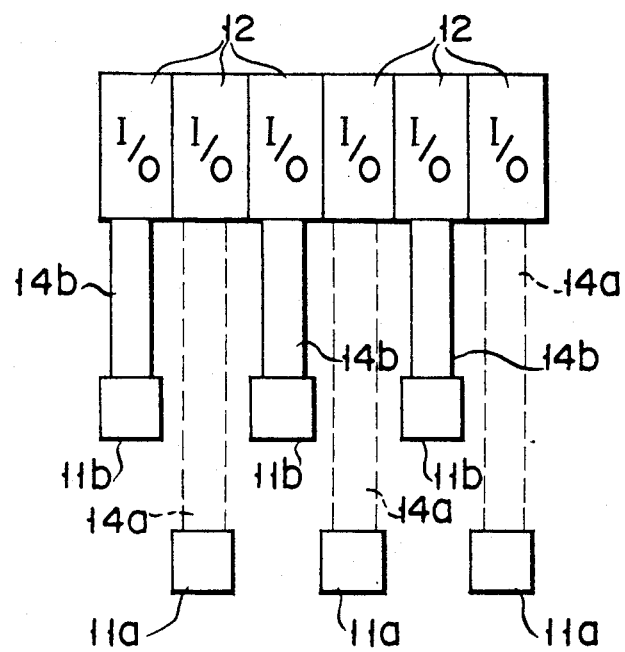
F I G. 4
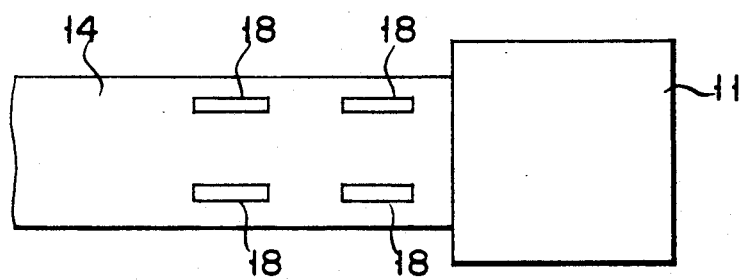
F I G. 5

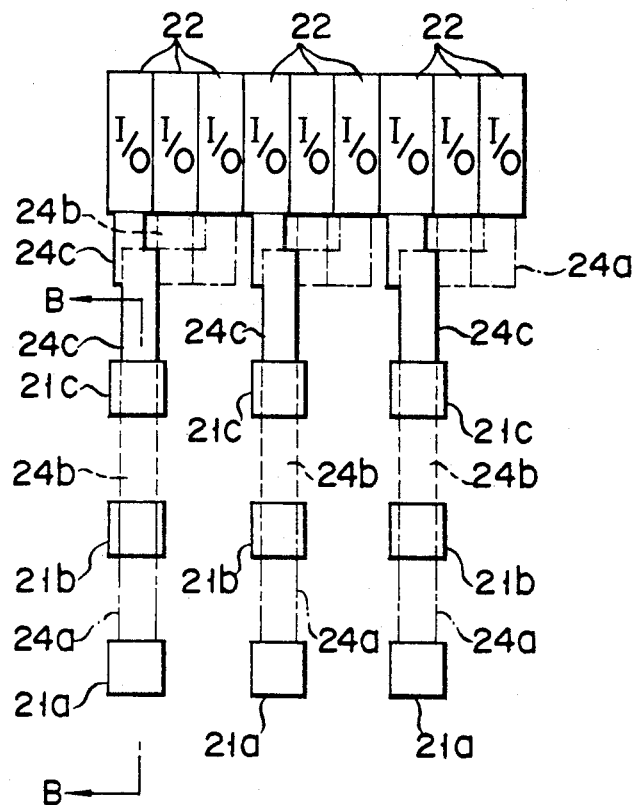
F I G. 6
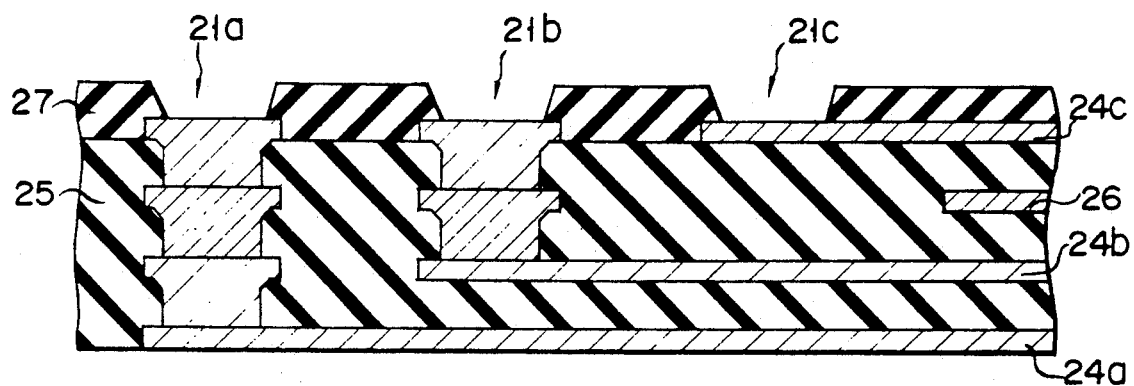
F I G. 7

SEMICONDUCTOR INTEGRATED CIRCUIT DEVICE HAVING PADS AT PERIPHERY OF SEMICONDUCTOR CHIP

This application is a continuation of application Ser. No. 07/619,995, filed Nov. 30, 1990 abandoned.

BACKGROUND OF THE INVENTION

1. Field of the Invention

The present invention relates to a semiconductor integrated circuit device, and more particularly, to a semiconductor integrated circuit device having pads disposed at a periphery of the semiconductor integrated circuit chip and multilevel wiring means electrically connected to the pads.

2. Description of the Related Art

Recently, fine pattern technologies of semiconductor devices have been rapidly developed, and the integration density of the semiconductor integrated circuit device (hereinafter referred to as "an LSI") has increased. When the integration density of the LSI is raised, high function and multi-function LSIs are naturally manufactured as products.

However, the high function and multi-function LSIs require more electric means for connecting the exterior of the device to the interior of the device. In other words, the LSI necessitates a number of pads.

The arrangement of the pads in the conventional LSI will be considered.

FIG. 11 is a plan view showing the most general conventional LSI. In the drawing, reference numeral 100 denotes an LSI chip, and pads 101 to be electrically connected to external terminals of a lead frame are arranged in one row along four sides of the chip. I/O circuits 102 of the LSI 100 are also formed in one row inside the rows of the pads 101. FIG. 12 is an enlarged view of the vicinity of the pads of the LSI shown in FIG. 11. In FIG. 12, it is understood that the I/O circuits 102 and the pads 101 are disposed at a predetermined pitch and are connected through interconnection layers 104 with one another.

Further, a plan view in FIG. 13 shows an LSI which has been proposed in order to increase the number of pads 101 while suppressing its area. In FIG. 13, reference numerals correspond to those in FIG. 11. In other words, the pads 101 are zigzag arranged to suppress both an increase in the pads 101 and an increase in the area of the LSI due to the increase in the pads 101. FIG. 14 is an enlarged view showing the vicinity of pads 101 of the LSI illustrated in FIG. 13. However, it is not still improved to suppress the increase in the area of the LSI. FIG. 15 shows an LSI which has been proposed in order to further suppress the increase in the area, illustrating an enlarged view of the vicinity of the pads thereof. That is, in the LSI with the zigzag arranged pads shown in FIG. 15, the width of interconnection layers 104 passing among pads 101 is reduced to suppress the increase in the area. However, in such an LSI, the reliability of the interconnection layers 104 may be lowered because the width of each interconnection layer is reduced. That is, since the current density flowing through interconnection layers 104 is increased, an unwanted electromigration may occur.

SUMMARY OF THE INVENTION

Accordingly, it is an object of the present invention to provide a semiconductor integrated circuit device having an improved arrangement of pads.

Another object of the present invention is to provide a semiconductor integrated circuit device having multilevel interconnection means electrically connected to the pads.

According to one aspect of the present invention, there is provided a semiconductor integrated circuit device which comprises a semiconductor chip including internal circuits, pads disposed at a periphery of the semiconductor chip and arranged in at least first and second rows, and multilevel interconnection means for electrically connecting the internal circuits to the pads. The interconnection means has at least first and second groups of the interconnection layers which are electrically connected to the pads arranged in at least first and second rows, respectively. The pads to be connected to external terminals such as leads of a lead frame are increased without increasing the area of the chip.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 3 is a sectional view taken along a line A—A' of FIG. 2;

FIG. 4 is a partly enlarged plan view showing pads of a semiconductor integrated circuit device according to a second embodiment of the present invention;

FIG. 5 is a plan view showing an interconnection structure in the semiconductor integrated circuit device of the present invention;

FIG. 6 is a partly enlarged plan view showing pads of a semiconductor integrated circuit device according to a third embodiment of the present invention;

FIG. 7 is a sectional view taken along a line B—B' of FIG. 6;

DETAILED DESCRIPTION OF THE PREFERRED EMBODIMENTS

A semiconductor integrated circuit device according to embodiments of the present invention will be described with reference to the accompanying drawings.

Figure 1:
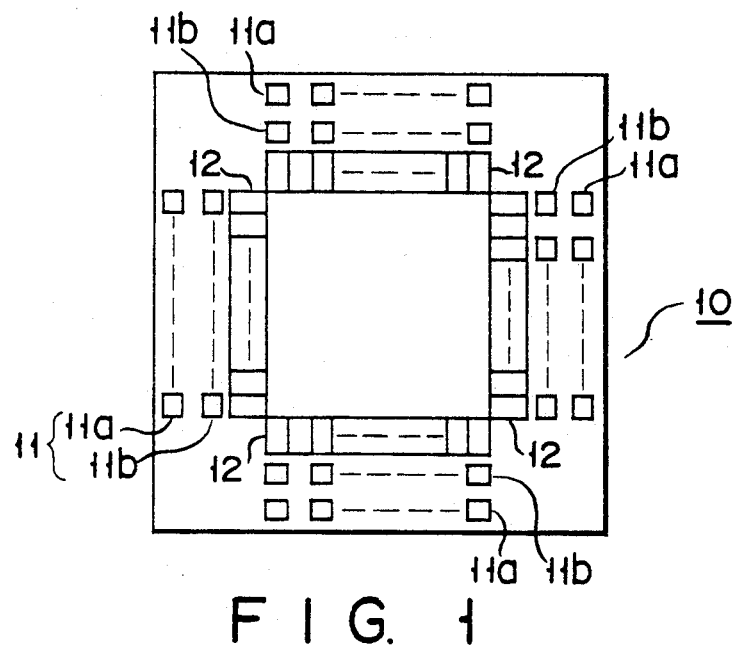
FIG. 1 is a plan view showing a semiconductor integrated circuit device according to a first embodiment of the present invention.

FIG. 1 is a plan view schematically showing a semiconductor integrated circuit device according to a first embodiment of the invention.

In FIG. 1, a reference numeral 10 denotes an LSI chip. The LSI chip has pads 11 (11a, 11b), which are electrically connected to external terminals of a lead frame and arranged in two rows at the periphery along four sides thereof. That is, the pads 11a provide a first row disposed at the outside portion of the chip, while the pads 11b render a second row located inside the first row of the pads 11a. The arrangement of the pads 11 has a structure which includes the first row of the pads 11a and the second row of the pads 11b. So-called I/O circuits 12 in circuits for providing the LSI are arranged in one row inside the second row of the pads 11b.

Figure 2:
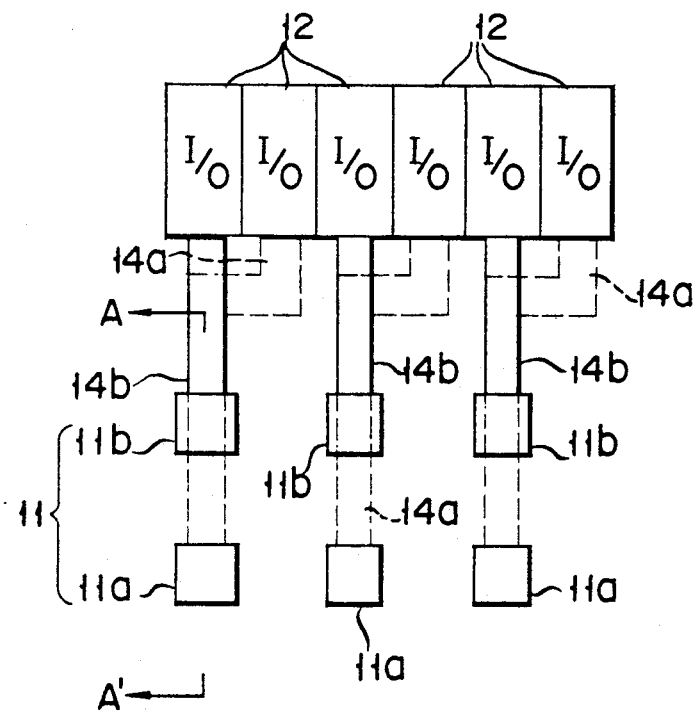
FIG. 2 is a partly enlarged plan view showing pads of the semiconductor integrated circuit device according to the first embodiment.

FIG. 2 is an enlarged view of the vicinity of the pads 11 of the LSI shown in FIG. 1.

In FIG. 2, the I/O circuits 12 and the pads 11 are disposed at a predetermined pitch. As described above, the pads 11 are arranged in the two rows provided by the first row of the pads 11a and the second row of the pads 11b, and the total number of the pads 11 is increased. These pads 11 are disposed at a minimum interval to perform a minimum pad forming area to be obtained by the maximum number of the pads 11. In other words, the pads 11 are disposed in such a manner that a greater decrease in the pad forming area cannot be obtained. In a multilevel interconnection structure for providing the arrangement of pads, interconnection layers 14a connected to pads 11a disposed at the most outside portion of the chip are provided by first wiring layers located at a deep position from the surface of the device. On the other hand, interconnection layers 14b connected to the pads 11b disposed inside the pads 11a are provided by second wiring layers located at a shallower position than the first wiring layers.

Thus, unwanted short circuit between first and second wiring layers can be prevented.

This considers that when the pads 11 are subjected to wire bonding, a damage of the wiring layers is increased as the position becomes shallow.

More specifically, according to the present invention, the interconnection layers 14a connected to the pads 11a are provided by the first wiring layers basically located at the deep position.

Thus, the damage of the interconnection layers 14a may be reduced during the wire bonding.

In relation to this point, the present invention further provides a consideration, which will be described with reference to FIG. 3.

FIG. 3 is a sectional view taken along a line A—A' of FIG. 2. As shown in FIG. 3, the interconnection layer 14a formed on the surface of the LSI chip is provided by a first wiring layer. A buffer layer 16 of a conductive material is provided above the interconnection layer 14a through an interlevel insulator 15. As a second wiring layer, the interconnection layer 14b is provided above the buffer layer 16 through the interlevel insulator 15.

More specifically, the consideration is that the buffer layer 16 is provided between first and second interconnection layers.

As described above, since the buffer layer 16 is provided in in the multilevel interconnection structure, the first wiring layer can be formed at a deep position from the surface of the device to dispose the interconnection layer 14a at the deep position. Thus, the interconnection layers 14a may be prevented from a unwanted damage during the wire bonding.

Various advantages due to the buffer layer 16 are provided. As a typical example, the step coverage of a contact layer (conductive layer) can be improved when it is formed in a contact hole for the internal interconnection layer 14a formed at a deep position from the surface of the device.

When the contact hole is formed in the interlevel insulator 15 at a deep position, the aspect ratio of the contact hole generally tends to increase. If the aspect ratio is increased, the step coverage of the contact layer is deteriorated as known in the art.

Particularly, in the case of pads subjected to wire bonding, it is required to provide contact layers having high surface planarity. To this end, a contact layer to become the pad 11a must have a preferable step coverage for the contact hole. In order that the contact layer has the preferable step coverage for the contact hole, it is important to reduce the aspect ratio as low as possible.

Therefore, if the buffer layer 16 described above is provided between first and second wiring layers, the contact hole is once buried with the buffer layer 16. Consequently, a depth of a contact hole to be next formed can be adjusted. If the depth of the contact hole is adjusted, the aspect ratio of the contact hole may be controlled.

Accordingly, the step coverage for the contact hole of the contact layer may be improved by adjusting the depth of the contact hole so that the aspect ratio becomes as low as possible.

The buffer layer 16 is not limited to one layer. Two or more layers may be employed in the semiconductor integrated circuit device according to the present invention if necessary.

Even if the buffer layer 16 is not especially provided for the purpose of the above described object, interconnection layers used in internal circuits of the LSI may be employed.

Further, in the multilevel interconnection structure, a desired pattern may be provided to each interconnection layer.

As a result, it is not necessary to excessively reduce the width of interconnection layers (e.g., 14a 14b shown in FIG. 2). Therefore, it may be possible to control the current density flowing through each interconnection layer.

Consequently, the decrease in the reliability of the interconnection structure and particularly the decrease in reliability related to electromigration can be prevented.

A method of making the device of the first embodiment and hence a method of forming the pads (11a, 11b) will be described with reference to FIG. 3.

Though not shown in FIG. 3, the interconnection layer 14a (the first wiring layer) is provided on an insulating layer formed on the chip. A first metal film for the first interconnection layer is deposited on the insulating layer (not shown) by, for example, sputtering techniques, and then patterned to a desired configuration by photoetching techniques, thereby providing the interconnection layer 14a on the insulating layer. Then, a first insulating film for the interlevel insulator 15 is deposited on the whole surface including the interconnection layer 14a by, for example, CVD techniques. Thereafter, a first contact hole is formed in the first insulating film by photoetching techniques so as to reach the interconnection layer 14a. A second metal film is deposited on the whole surface including the first contact hole by, for example, sputtering techniques, and then patterned by photoetching techniques, thereby providing the buffer layer 16 and the first contact layer (denoted by 16) buried in the first contact hole at the same time. Thereafter, a second insulating film for the interlevel insulator 15 is deposited on the whole surface by, for example, CVD techniques, and a second contact hole reaching the contact layer is cut in the second insulating film by photoetching techniques. At this time, the aspect ratio of the second contact hole is adjusted, as described above, to improve the step coverage of a the second contact layer to be formed in the second contact hole. A third metal film for the interconnection layer 14b (second wiring layer) is deposited on the whole surface by, for example, sputtering techniques, and then patterned by photoetching techniques, thereby providing the interconnection layer 14b and the second contact layer buried in the second contact hole. Subsequently, a surface passivation film 17 is formed on the whole surface by, for example, CVD techniques, and third contact holes is then cut in the surface passivation film 17 by photoetching techniques so as to reach both the interconnection layer 14b and the second contact layer. Consequently, the pads 11a and 11b are provided.

As the arrangement pattern of pads 11 according to the invention, a zigzag arrangement type pattern may be employed instead of the arrangement pattern shown in FIG. 1. Such an example is shown as a second embodiment in FIG. 4. In the drawing, reference numerals correspond to those in FIG. 2.

As shown in FIG. 4, the chip (not shown) includes pads 11a arranged in a first row and pads 11b arranged in a second row. The first row is disposed at the most outside portion of the chip and shifted from the second row by a predetermined distance to provide the zigzag arrangement type pattern.

In this case, the interconnection structure has the multilevel wiring structure in the same manner as the first embodiment. The interconnection layers 14a connected to the pads 11a of the first row are provided by the first wiring layers disposed at the deepest position from the device surface. The interconnection layers 14b connected to the pads 11b of the second row are also provided by the second wiring layers disposed at the shallower position than the first wiring layers.

Accordingly, the advantage of reducing damage caused during the wire bonding can be also provided In the second embodiment, since the pads 11 (11a, 11b) are arranged at a minimum interval, the zigzag arrangement pattern can realize the minimum pad forming area obtained by the maximum number of pads 11.

Further, buffer layers 16 may be provided between the interconnection layer 14a of the first wiring layer and the interconnection layer 14b of the second wiring layer as shown in FIG. 3.

The arrangement of the pads and the wiring structure in the semiconductor integrated circuit device according to the present invention have been described.

However, when an LSI chip, i.e., a semiconductor integrated circuit chip with circuit elements is sealed with resin, it becomes a problem that unwanted cracks are caused in the surface passivation film 17 (insulating layer). If cracks occur in the surface passivation film 17 of the chip, the reliability of the semiconductor integrated circuit device itself may be lowered, and its manufacturing yield may be decreased to raise the cost of products.

The cause of the cracks may depend upon a difference between the thermal expansion coefficients of the chip and the molded resin. The cracks are caused at the peripheral edge of the chip. Therefore, it may be presumed that the cracks are affected by the thermal expansion coefficient of the contact layers for providing the pads 11.

In the semiconductor integrated circuit device according to the present invention, a great number of pads are employed as described above, and disposed densely in the narrow area.

Therefore, it is desirable to provide any countermeasure for preventing the problem of the cracks to suppress a decrease in the reliability.

Thus, means for suppressing the decrease in the reliability due to the cracks of the semiconductor integrated circuit device according to the present invention will now be described.

In order to solve the problem of cracks caused in the surface passivation film of the LSI chip, it is important how to reduce stress generated due to the difference between the thermal expansion coefficients of the molded resin and the LSI chip. Since the surface passivation film is interposed between the interconnection layers and the molded resin in the vicinity of the contact layers for providing the pads, materials with different thermal expansion coefficients are densely disposed in such a region so that the width in the depth direction is relatively narrow. As the cracks frequently occur at such positions, it is considered to be most effective to reduce the stress produced due to the difference between the thermal expansion coefficients of the material densely disposed thereat.

Therefore, at least one interconnection layer is provided by a structure as shown in FIG. 5. In the drawing, reference numeral 14 denotes the interconnection layer, and the pad 11 is disposed at one end. Slits 18 are provided in the interconnection layer 14.

As described above, the slits 18 are provided in the interconnection layer 14, and particularly in the interconnection layer 14b near the surface, thereby dispersing the stress produced particularly in the surface passivation film due to the difference of the thermal expansion coefficients.

Therefore, in the surface passivation film of the LSI chip, for example, the surface passivation film 17 shown in FIG. 3, the cracks may be effectively prevented. Particularly, in a semiconductor integrated circuit device having a great number of pads according to the present invention, a decrease in the reliability of the device itself may be suppressed.

The structure in which the pads are disposed in two rows as shown in the first and second embodiments has been essentially described in detail. However, the arrangement of the pads are not limited to the double row, but may be arranged in three or more rows.

Pads arranged in three rows will be described as a third embodiment.

FIG. 6 is a plan view schematically showing an arrangement of pads of a semiconductor integrated circuit device according to the third embodiment of the present invention and particularly illustrating an enlarged plan view in the vicinity of the pads.

The device of the third embodiment has a similar plane configuration as the device shown in FIG. 1 except the arrangement of pads, and hence a drawing for the entire plane configuration will be omitted.

As shown in FIG. 6, I/O circuits 22 and pads 21 (21a, 21b, 21c) are arranged at a predetermined pitch in the same manner as the first embodiment. The pads 21 are arranged in triple rows which include a first row of pads 21a, a second row of pads 21b and a third row of pads 21c. The total number of pads 21 is further increased as compared with that of the first embodiment. In this embodiment, pads 21 are disposed at the minimum interval, and the minimum pad forming area to be obtained in the maximum number of the pads 21 is performed. In a multilevel interconnection structure for providing the arrangement of pads, interconnection layers 24a, which are connected to pads 21a disposed at the most outside portion of the chip, are provided by first wiring layers formed at a deep position from the surface of the device. Interconnection layers 24b connected to the pads 21b disposed inside the pads 21a are formed of second wiring layers provided at a shallower position than the first wiring layers, and interconnection layers 24c connected to the pads 21c disposed inside the pads 21b are formed of third wiring layers provided at a shallower position than the second wiring layers. Therefore, an unwanted damage of the interconnection layers 24a and 24b may be reduced during wire bonding.

FIG. 7 is a view taken along a line B—B' of FIG. 6. As shown in the drawing, even in the third embodiment, a buffer layer 26 may be provided similarly to the first embodiment, between the third wiring layer (interconnection layer 24c) and the second wiring layer (interconnection layer 24b). Accordingly, the first wiring layers can be provided at a deeper position from the surface of the device, thereby reducing damage to the interconnection layers 24a during wire bonding.

Further, when contact holes reaching the first wiring layer (interconnection layer 24a) and the second wiring layer (interconnection layer 24b) are cut in the interlevel insulator 25, a buffer layer 26 is provided to adjust the depth of the contact hole and the aspect ratio.

Therefore, the step coverage for the contact holes of the second wiring layers can be improved by adjusting the depth so as to reduce the aspect ratio as low as possible.

Further, in the third embodiment as shown in FIG. 7, the aspect ratio of the contact hole reaching the first wiring layer 24a can be adjusted by the second interconnection layer 24b.

The pads 21c are provided by depositing a metal film for the third wiring layer (interconnection layer 24c) on the interlevel insulator 25, patterning the deposited metal film to form the arrangement of pads and the interconnection layers 24c, depositing a surface passivation film 27 on the surface, and forming contact holes in the passsivation film 27 to expose the interconnection layers 24c, respectively.

A buffer layer having a similar function to that of the buffer layer 26 may be formed between the first wiring layer (24a) and the second wiring layer (24b).

This is because the first wiring layer (24a) is indispensably formed at a sufficiently deep position from the surface of the device due to the three-layer interconnection structure, so that damage to the interconnection layers 24a can be reduced during wire bonding.

In the third embodiment described above, the multilevel interconnection layers 24a, 24b, 24c connected to the pads 21a, 21b, 21c, arranged in three rows, are provided by the three-level interconnection layers, but they may also be provided by the two-level interconnection layers.

Such an example will be described as a fourth embodiment with reference to FIG. 8.

Figure 8:
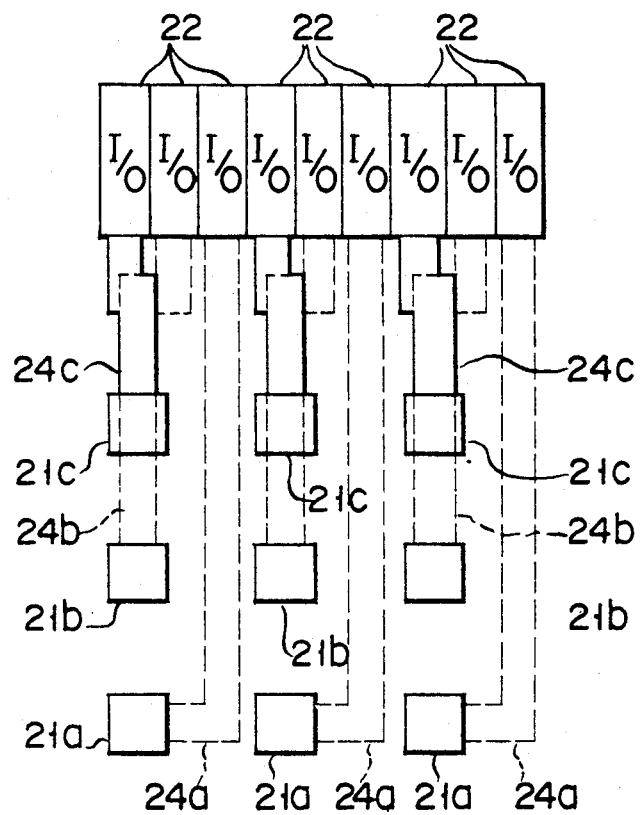
FIG. 8 is a partly enlarged plan view showing pads of a semiconductor integrated circuit device according to a fourth embodiment of the present invention.

FIG. 8 schematically shows a structure of a semiconductor integrated circuit device according to a fourth embodiment, and particularly shows an enlarged plan view of the vicinity of pads. In FIG. 8, reference numerals correspond to those in FIG. 7.

As shown in FIG. 8, if wiring patterns are provided in such a manner that interconnection layers 24a connected to pads 21a do not intersect with interconnection layers 24b connected to pads 21b, the interconnection layers 24a and 24b may be formed by the wiring layers having the same level. In this example, they are provided by the first wiring layers formed on the chip surface.

It has been required to increase the number of pads in LSIs, depending upon the requirement for LSIs having a high function and a multifunction capability. In addition, terminals for testing functions of LSIs have been desired. If LSIs have a high function and a multifunction capability, the number of internal circuits may be naturally increased. If the number of the internal circuits is increased, functional test patterns for considering the connection among of the internal circuits may also be increased.

Therefore, when functional test terminals for only the internal circuits are provided, it may not be necessary to particularly consider the connection among the internal circuits, and it may be possible to provide test patterns for carrying out functional tests of desired circuits.

From the foregoing description, when the functional test terminals are present, the quantity of the functional test patterns may be considerably reduced.

Further, if undesired faults occur in LSIs having the functional test terminals for testing only the internal circuits, it may be possible to monitor the operating conditions of the internal circuits. Consequently, it may be easy to find faulty internal circuits.

Form the above-described point of view, the functional test terminals have been required for LSIs. however, if the LSI is intended to separately provide the functional test terminals, the number of pads may be increased to increase the area of the LSI. Accordingly, it has been difficult in LSIs to adopt the functional test terminals.

However, according to the semiconductor integrated circuit device of the present invention, an increase in the pad area is suppressed to increase the number of pads. Therefore, an optimum structure may be provided to adopt the functional test terminals.

An example of a semiconductor integrated circuit device according to the present invention provided with the functional test terminals will be described as a fifth embodiment with reference to FIGS. 9 and 10.

Figure 9:
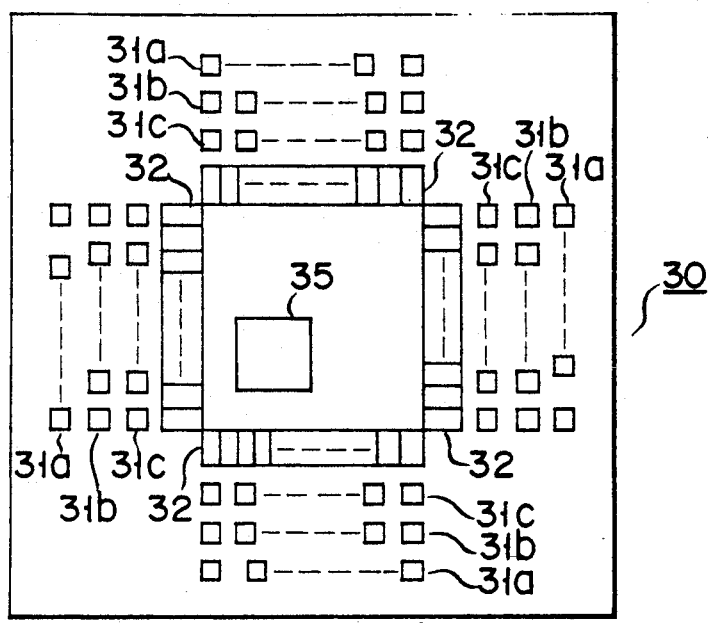
FIG. 9 is a plan view showing a semiconductor integrated circuit according to a fifth embodiment of the present invention.

FIG. 9 is a plan view schematically showing a semiconductor integrated circuit device according to the fifth embodiment of the present invention.

In FIG. 9, a reference numeral 30 denotes an LSI chip. Pads 31 (31a, 31b, 31c) electrically connected to external terminals of a lead frame are arranged in three rows at a periphery of the chip along four sides thereof. I/O circuits 32 in circuits for providing an LSI are arranged in one row which is disposed inside the row of the pads 31c arranged at the most inside portion of the chip. An internal circuit 35 is shown in the chip.

Figure 10:
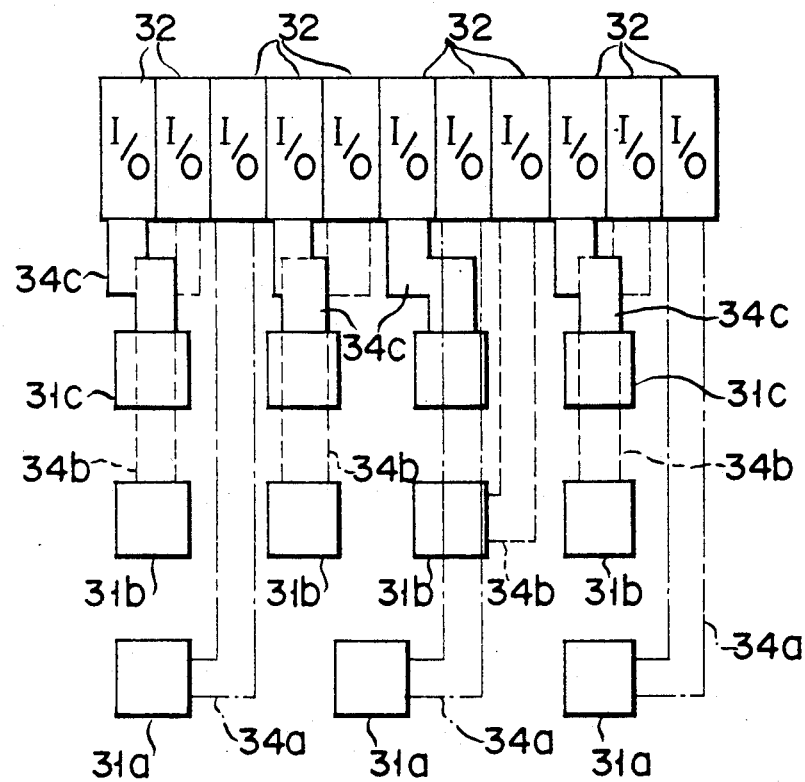
FIG. 10 is a partly enlarged plan view showing pads of the semiconductor integrated circuit device according to fifth embodiment of the present invention.
Figure 11:
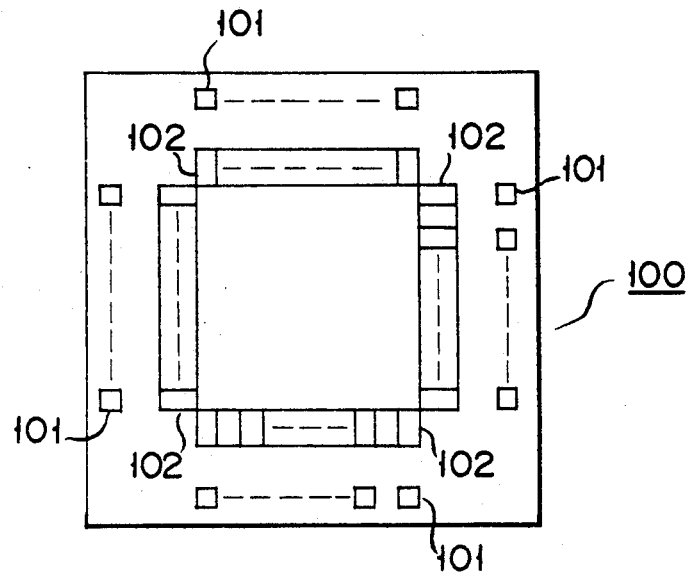
FIG. 11 is a plan view showing a first conventional semiconductor integrated circuit device.
Figure 12:
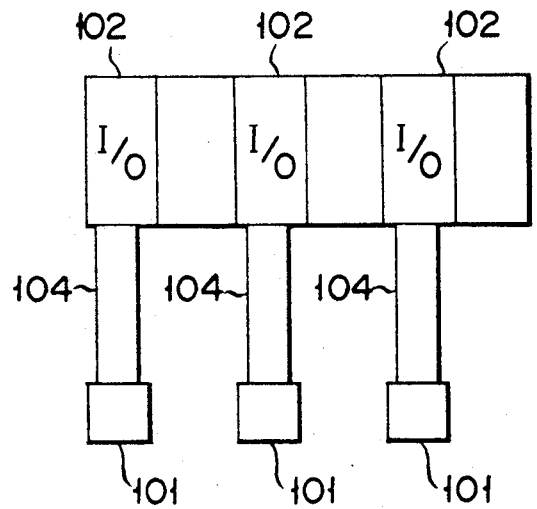
FIG. 12 is a partly enlarged plan view showing pads of the first conventional semiconductor integrated circuit device.
Figure 13:
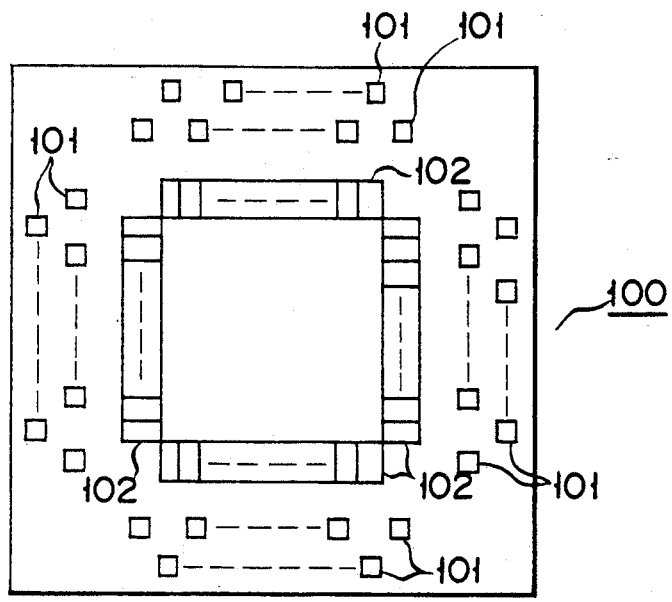
FIG. 13 is a plan view showing a second conventional semiconductor integrated circuit device.
Figure 14:
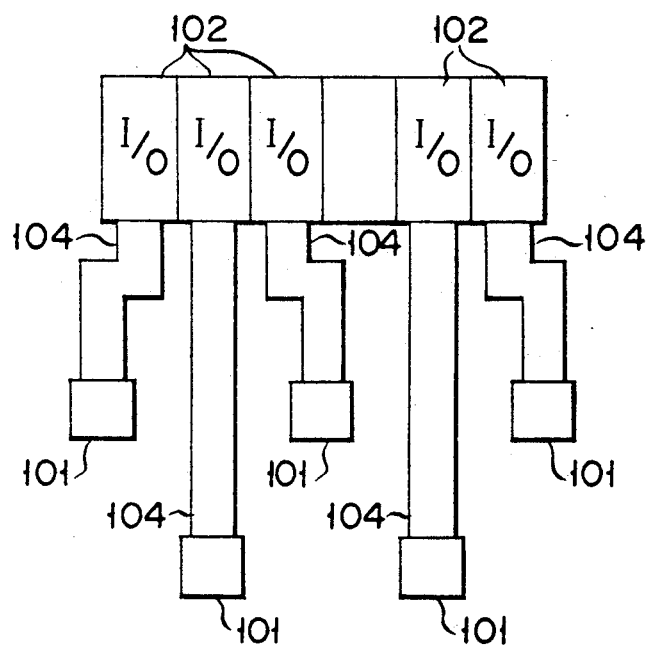
FIG. 14 is a partly enlarged plan view showing pads of the second conventional semiconductor integrated circuit device.
Figure 15:
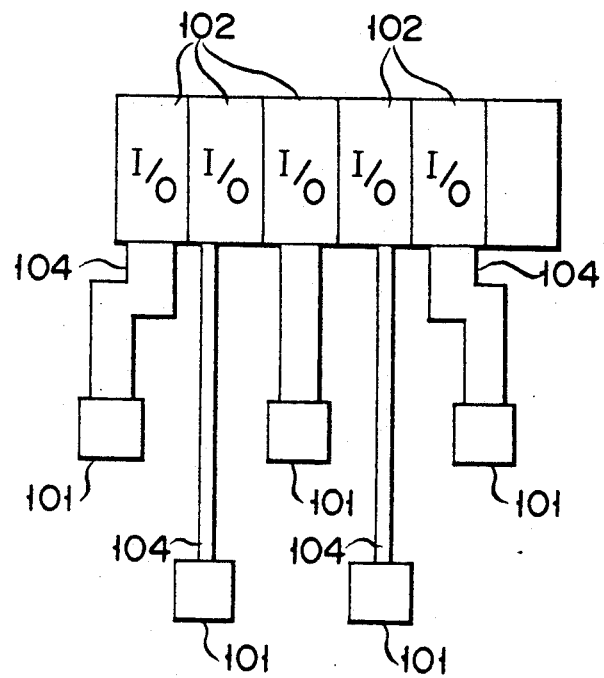
FIG. 15 is a partly enlarged plan view showing pads of the second conventional semiconductor integrated circuit.

FIG. 10 is an enlarged view of the vicinity of the pads 31 of the LSI shown in FIG. 9.

In this case, the row of pads 31a and the rows of pads 31b, 31c are arranged at a different pitch. This is because bonding wires are connected to the row of pads 31a, while the rows of 31b and 31c are used as functional test terminals.

It is unnecessary to connect bonding wires to the functional test terminals.

Therefore, it may be possible to reduce the arrangement pitch of the rows of 31b, 31c as compared with that of pads 31a.

Interconnection layers 34a connected to the pads 31a are provided by first wiring layers. Similarly, interconnection layers 34b and 34c connected to the pads 31b and 31c are provided by second and third wiring layers, respectively. The positions of the first to third wiring layers are such that the wiring layers connected to the pads 31a disposed at the outside of the chip are provided at the deepest position, and the residual wiring layers are sucessively provided at shallower positions as they are connected to rows of pads arranged at the inside portions.

As described above, the present invention can provide functional test terminals without difficulty.

When the pads to become the functional test terminals are provided, the existing bonding machine can be used, and the pads 31a disposed at the most outside portions are desirably electrically connected to external terminals.

In the semiconductor integrated circuit device as described above, since a plurality of the pads disposed at the periphery of the semiconductor integrated circuit chip are arranged in double or more rows toward the edge of the chip, the number of the pads can be increased. Further, since at least two wiring layers for providing the internal interconnection layers for electrically connecting the pads to the internal circuits are provided, desired wiring layers for providing interconnection layers can be selected in respective pads, and also prevented from causing an unwanted short circuit.

Since the multilevel interconnection layers connected to pads include wiring layer provided at the deep position from the surface of the device, damage can be reduced during wire bonding.

More specifically, since the interconnection layers can be formed directly under the pads, the increase in the area of the semiconductor integrated circuit device can be further suppressed.

The wiring layers with at least two-layer structure can be provided in such a manner that each of them has a desired pattern. As a result, it is not required to reduce the width of each interconnection layer provided by each wiring layer, and it can be possible to sufficiently control the current density flowing through each interconnection layer. consequently, the reliability of the multilevel interconnection structure may not be lowered.

It is further understood by those skilled in the art that the foregoing description is a preferred embodiment of the disclosed device and that various changes and modifications may be made in the invention without departing from the spirit and scope thereof.

What is claimed is:

1. A semiconductor integrated circuit device comprising:
   a semiconductor chip including I/O circuits connected to internal circuits;
   a plurality of pads disposed at a periphery of said semiconductor chip, said pads being arranged in first and second rows and columns;
   multilevel interconnection means for electrically connecting said I/O circuits to said pads, said multilevel interconnection means having first and second groups of interconnection layers insulated by an interlevel insulator;
   said interlevel insulator including a buffer layer therein; and
   said interconnection layers being electrically connected to said pads of said first and second rows so that said interconnection layers of said first group overlap said interconnection layers of said second group, with said interlevel insulator interposed between said first and second groups of interconnection layers.

2. The device according to claim 1, wherein said buffer layer is comprised of a conductive material.

3. The device according to claim 1, wherein said second group of interconnection layers includes a plurality of slits along longitudinal sides thereof.

4. The device according to claim 1, wherein said pads of said first and second rows and columns are disposed along each of four sides of said semiconductor chip.

5. The device according to claim 4, wherein said pads of said first row are closer to each of said four sides than those of said second row.

6. The device according to claim 1, wherein said second group of interconnection layers is disposed above said first group of interconnection layers through said interlevel insulator.

7. The device according to claim 1, wherein said first group of interconnection layers is electrically connected to said pads of said first row, and said second group of interconnection layers is electrically connected to said pads of said second row.

8. The device according to claim 1, wherein said pads are arranged in first, second, and third rows.

9. The device according to claim 8, wherein said pads of said first row are electrically connected to external terminals.

10. The device according to claim 8, wherein said pads of said second and third rows are used as functional test terminals.

* * * * *